(12) United States Patent
Szeles et al.

(10) Patent No.: US 7,612,345 B2
(45) Date of Patent: Nov. 3, 2009

(54) RADIATION DETECTOR CRYSTAL AND METHOD OF FORMATION THEREOF

(75) Inventors: Csaba Szeles, Allison Park, PA (US); Scott E. Cameron, Lower Burrell, PA (US); Vincent D. Mattera, Jr., Gibsonia, PA (US); Utpal K. Chakrabarti, Allentown, PA (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 248 days.

(21) Appl. No.: 10/594,934

(22) PCT Filed: Jan. 27, 2006

(86) PCT No.: PCT/US2006/003152

§ 371 (c)(1),
(2), (4) Date: Oct. 29, 2007

(87) PCT Pub. No.: WO2006/081532

PCT Pub. Date: Aug. 3, 2006

(65) Prior Publication Data

US 2009/0041648 A1  Feb. 12, 2009

Related U.S. Application Data

(60) Provisional application No. 60/647,589, filed on Jan. 27, 2005.

(51) Int. Cl.
*G01T 1/24* (2006.01)
(52) U.S. Cl. .................... 250/370.13; 257/614
(58) Field of Classification Search ............ 250/370.01, 250/370.12, 370.13; 257/614
See application file for complete search history.

(56) References Cited

U.S. PATENT DOCUMENTS

| 4,642,799 A | 2/1987 | Glass |
| 6,331,705 B1 | 12/2001 | Eisen et al. |
| 6,649,915 B2 | 11/2003 | Wright et al. |
| 2003/0209184 A1 | 11/2003 | Kazandjian et al. |
| 2004/0046123 A1* | 3/2004 | Dausch ....................... 250/351 |

(Continued)

OTHER PUBLICATIONS

Yu and Ridgway, Zinc and phosphorus co-implantation in indium phosphide, Applied Physics Letters, Jul. 6, 1998, pp. 52-54, vol. 73, No. 1, American Institute of Physics.

(Continued)

*Primary Examiner*—David P Porta
*Assistant Examiner*—Mark R Gaworecki
(74) *Attorney, Agent, or Firm*—Hinman, Howard & Kattell

(57) ABSTRACT

A radiation detector crystal is made from CdxZn1-xTe, where $0 \leq x \leq 1$; an element from column III or column VII of the periodic table, desirably in a concentration of about 1 to 10,000 atomic parts per billion; and the element Ruthenium (Ru), the element Osmium (Os) or the combination of Ru and Os, desirably in a concentration of about 1 to 10,000 atomic parts per billion using a conventional crystal growth method, such as, for example, the Bridgman method, the gradient freeze method, the electro-dynamic gradient freeze method, the so-call traveling heater method or by the vapor phase transport method. The crystal can be used as the radiation detecting element of a radiation detection device configured to detect and process, without limitation, X-ray and Gamma ray radiation events.

15 Claims, 1 Drawing Sheet

U.S. PATENT DOCUMENTS

2007/0178039 A1* 8/2007 D'Evelyn et al. ........... 423/508
2007/0181056 A1* 8/2007 D'Evelyn et al. ............. 117/11

OTHER PUBLICATIONS

Yu and Ridgway, Zinc and group V element co-implantation in indium phosphide, Nuclear Instruments and Methods in Physics Research, Oct. 12, 1999, pp. 65-71, vol. B, Elsevier Science B.V.

Dadgar et al., Ruthenium a new thermally stable compensator in InP, 10th International Conference on Indium Phosphide and Related Materials, May 11-15, 1998, pp. 57-59, IEEE, Tsukuba, Japan.

Van Geelen et al., Ruthenium doped high power 1.48 um SIPBH laser, 11th International Conference on Indium Phosphide and Related Materials, May 16-20, 1999, pp. 203-206, IEEE, Davos, Switzerland.

Dadgar et al., Ruthenium—a superior compensator of InP, Applied Physics Letters, Dec. 28, 1998, pp. 1-3.

Dadgar et al., Growth of Ru doped semi-insulating InP by low pressure metalorganic chemical vapor deposition, Proc. of the 9th IC-MOVPE, 1998, pp. 1-5, La Jolla, CA USA.

Barnes and Zanio, Thermally stimulated current measurement of traps in detector-grade CdTe, IEEE Transactions on Nuclear Science, Feb. 1976, pp. 177-181, vol. NS-23, No. 1.

Barnes and Zanio, Photoluminescence in high-resistivity CdTe:In, Journal of Applied Physics, Sep. 1975, pp. 3959-3964, vol. 46, No. 9, American Institute of Physics.

Kuhn et al., Evidence of deep donor in CdTe, Journal of Crystal Growth, 1992, pp. 660-665, vol. 117, Elsevier Science Publishers B.V.

* cited by examiner

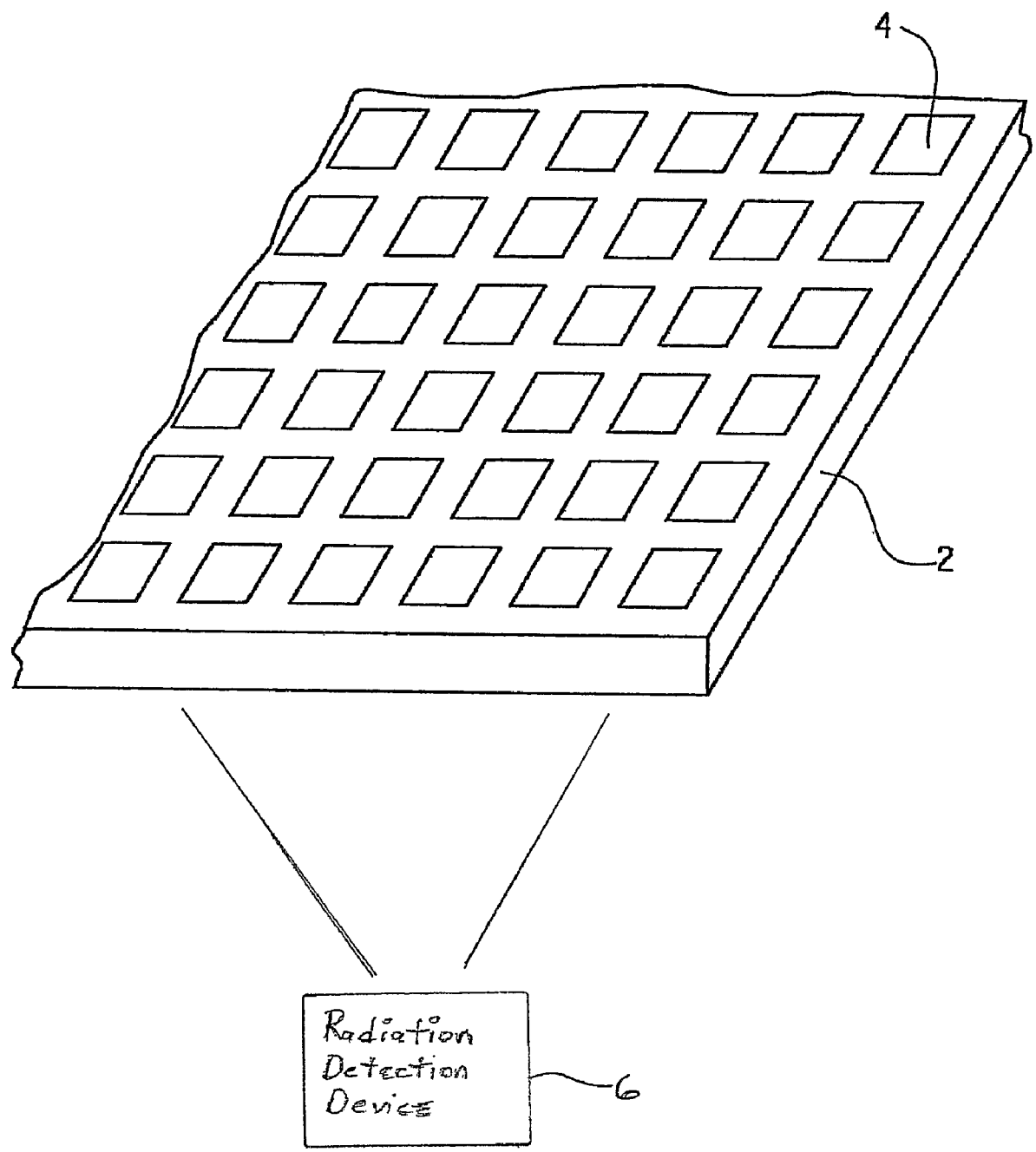

RADIATION DETECTOR CRYSTAL AND METHOD OF FORMATION THEREOF

BACKGROUND OF THE INVENTION

1. Field of the Invention

The present invention relates to radiation detector crystals for detecting, among other things, X-ray and gamma-ray radiation and to a method of forming said crystals.

2. Description of Related Art

It is known in the art that doped Indium-Phosphide (InP) crystals, made from elements in columns III and V of the periodic table of the elements, can be used to form high speed Integrated Circuits (ICs), lightwave communication devices, such as semiconductor lasers useful for fiber optic communications, and the like. See, e.g., K. M. Yu and M. C. Ridgway, Appl. Phys. Lett 37, pp. 52-54 (1998); K. M. Yu and M. C. Ridgway, Nucl. Instrum. Methods B 168, pp. 65-71 (2000); "Ruthenium: A New Thermally Stable Compensator in InP", Int. Conf. On InP and Related Material, pp. 11-15, May 1998, Tsukuba, Japan; "Ruthenium Doped High-Power 1.48 μm SIPBH Laser", Int. Conf. On InP and Related Material, pp. 16-20, May 1999, Davos, Switzerland; "Ruthenium—a superior compensator of InP", A. Dadgar et al., Applied Physics Letters 28, December 1998; "Growth of Ru doped semi-insulating InP by low pressure metal organic chemical vapor deposition", A. Dadgar et al., Proc. of the $9^{th}$ IC-MOVPE, La Jolla, Calif. (1998); and U.S. Pat. No. 4,642,799 to Glass. However, it is also known in the art that doped InP is not best for X-ray and Gamma ray radiation detection.

In contrast, it is known in the art that doped $Cd_xZn_{1-x}Te$, where $0 \leq x \leq 1$, made from elements in columns II and VI of the periodic table of the elements, can be used to form radiation detector crystals. See, e.g., U.S. Patent Application Publication No. US 2003/0209184 to Kazandjian et al., filed Mar. 5, 2003; "Thermally Stimulated Current Measurement Of Traps In Detector-Grade CdTe", Barnes and Zanio, IEEE Trans. Nucl. Sci. NS-23, p. 177 (1976); "PL In High-Resistivity CdTe:In", Barnes and Zanio, J. Appl. Phys. 46, p. 3959 (1975); "Evidence of Deep Donor in CdTe". Kuhn, Ossau, Waag, Bicknell-Tassius and Landwher, J. Crystal Growth, v. 117, p. 660 (1992); and "Chlorine-Related Photoluminescence Lines In High-Resistivity Cl-Doped CdTe", Seto, Tanaka, Mase and Kawashima, J. Crystal Growth, v. 117, p. 271 (1992).

Because (1) InP and (2) $Cd_xZn_{1-x}Te$, where $0 \leq x \leq 1$, are formed from different elements from the periodic table of the elements, it is believed by the present inventors, that those skilled in the art would not consider using doping techniques applicable to InP, used to form high speed ICs and lightwave communication devices, for doping $Cd_xZn_{1-x}Te$, where $0 \leq x \leq 1$, to form radiation detector crystals for detecting high energy radiation events. Moreover, as best known by the present inventors, the literature is also silent regarding the applicability and desirability of forming $Cd_xZn_{1-x}Te$, where $0 \leq x \leq 1$, radiation detector crystals utilizing doping techniques used to make InP crystals used to form ICs and lightwave communication devices.

SUMMARY OF THE INVENTION

The invention is a radiation detector made from $Cd_xZn_{1-x}Te$, where $0 \leq x \leq 1$; an element from column III or column VII of the periodic table desirably in a concentration between 1 and 10,000 atomic parts per billion; and the element Ruthenium (Ru), Osmium (Os) or the combination of Ru and Os desirably in a concentration of between 1 and 10,000 atomic parts per billion.

The invention is also a radiation detection device comprising a crystal made from a combination of $Cd_xZn_{1-x}Te$, where $0 \leq x \leq 1$; an element from column III or column VII of the periodic table of the elements; and the element Ruthenium (Ru), the element Osmium (Os) or a combination of Ru and Os.

Lastly, the invention is also a method of forming a radiation detector crystal comprising: (a) providing a melt comprised of: (1) a mixture of $Cd_xZn_{1-x}Te$, where $0 \leq x \leq 1$, (2) a first dopant that adds shallow level donors (electrons) to the top of an energy band gap of said mixture when it is solidified, and (3) a second dopant that adds deep level donors and/or acceptors to the middle of said energy band gap of said mixture when it is solidified, wherein the second dopant is one of the elements of Ruthenium (Ru) and Osmium (Os); and (b) solidifying said melt in a manner to form the crystal.

The melt can also include a third dopant that adds deep level donors and/or acceptors to the middle of said energy band gap of said mixture when it is solidified, wherein the third dopant is the other one of the elements of Ruthenium (Ru) and Osmium (Os).

The first dopant can be an element from column III or column VII of the periodic table of the elements. The first dopant can be an element selected from the group consisting of B, Al, Ga, In, Ti, F, Cl, Br and I.

A concentration of the first dopant in the compound can be between 1 and 10,000 atomic parts per billion. A concentration of the element Ru, the element Os or the combination of the elements Ru and Os in the compound can be between 1 and 10,000 atomic parts per billion.

The radiation detector crystal can be formed by way of the Bridgman method, the gradient freeze method, the electrodynamic gradient freeze method, the so-call traveling heater method or by the vapor phase transport method. At least one of step (a) and step (b) can be performed in the presence of an inert gas. This gas can be Nitrogen (N) or an inert gas such as Helium (He), Neon (Ne), Argon (Ar), Krypton (Kr), Xenon (Xe), Hydrogen (H) or Deuterium (D), or a combination of gases such as, without limitation, N/H, He/H, Ne/H, Ar/H, Kr/H, Xe/H, N/D, He/D, Ne/D, Ar/D, Kr/D and Xe/D.

BRIEF DESCRIPTION OF THE DRAWING

FIG. 1 is a perspective view of a $Cd_xZn_{1-x}Te$ ($0 \leq x \leq 1$) wafer formed in accordance with the present invention, including a plurality of spaced pixels, wherein the wafer comprises a radiation detection device shown in block diagram form.

DETAILED DESCRIPTION OF THE INVENTION

The present invention is a novel and non-obvious semi-insulating low-defect crystal for X-ray and gamma-ray radiation detector applications and a method for forming said crystal. The invention will be described in connection with semi-insulating $Cd_xZn_{1-x}Te$ ($0 \leq x \leq 1$) for radiation detector applications, where the $0 \leq x \leq 1$ concentration or mole fraction range encompasses CdZnTe with any Zn percentage including ZnTe (x=0) and CdTe (x=1).

In accordance with the present invention, specific combination(s) of impurity atoms in specific quantities are introduced into $Cd_xZn_{1-x}Te$ ($0 \leq x \leq 1$) in a controlled way to reliably produce extrinsic (i.e., doped) $Cd_xZn_{1-x}Te$ ($0 \leq x \leq 1$) having high resistivity (semi-insulating) and excellent carrier transport properties. Specifically, two or more different impurities (dopants) are deliberately incorporated to the crystals during the crystal growth process to obtain $Cd_xZn_{1-x}Te$ ($0 \leq x \leq 1$) with the desired resistivity and carrier transport properties.

More specifically, an element from column III of the periodic table, i.e., boron (B), aluminum (Al), gallium (Ga), indium (In) or thallium (Tl), or from column VII of the periodic table, i.e., fluorine (F), chlorine (Cl), bromine (Br) or iodine (I), is introduced into $Cd_xZn_{1-x}Te$ ($0 \leq x \leq 1$) in the 1 atomic parts per billion (ppb) to 10,000 atomic parts per billion (ppb) concentration range (i.e., 1-10,000 ppb) in parallel with one or both of the elements Ruthenium (Ru) and Osmium (Os) in the 1 atomic parts per billion (ppb) to 10,000 atomic parts per billion (ppb) concentration range (i.e., 1-10,000 ppb). Thus, doping is achieved either with Ru or Os individually or in combination.

The indicated dopant concentrations can be measured by Glow Discharge Mass Spectroscopy (GDMS) in the resulting $Cd_xZn_{1-x}Te$ ($0 \leq x \leq 1$) crystals. The resulting $Cd_xZn_{1-x}Te$ ($0 \leq x \leq 1$) crystals are referred to as co-doped by X-Y, where "X" equals one of the elements B, Al, Ga, In, Tl, F, Cl, Br, I and "Y" equals the element Ru or Os (e.g., Al—Ru, In—Ru, Cl—Ru, I—Ru, Al—Os, In—Os, Cl—Os, I—Ru, etc.). Alternatively, the resulting $Cd_xZn_{1-x}Te$ ($0 \leq x \leq 1$) crystals are referred to as tri-doped by X-Y-Z, where "X" equals one of the elements B, Al, Ga, In, Tl, F, Cl, Br, I; "Y" equals the element Ru; and "Z" equals the element Os (e.g., Al—Ru—Os, In—Ru—Os, Cl—Ru—Os, I—Ru—Os, etc).

The described method works on the principle of electrical compensation. Intrinsic (undoped) $Cd_xZn_{1-x}Te$ ($0 \leq x \leq 1$) is typically rendered low resistivity due to doping by the uncontrolled amount of residual impurities and native defects, such as cadmium vacancies, incorporated to the material during crystal growth. These crystal defects are ionized at ambient temperature and provide an ample supply of free charge carriers (electrons or holes) resulting in conductive or low resistivity $Cd_xZn_{1-x}Te$ ($0 \leq x \leq 1$). The concentration of free charge carriers in these undoped crystals is typically proportional to the concentration of the defects of their origin. The defects also trap the charge carriers generated by the external X-ray or gamma-ray radiation limiting their transport and the use of the material in radiation detector devices.

In intrinsic $Cd_xZn_{1-x}Te$ ($0 \leq x \leq 1$), cadmium vacancies (vacant lattice sites) are generally considered as the dominant native defects that supply a high concentration of holes to the valence band of the $Cd_xZn_{1-x}Te$ ($0 \leq x \leq 1$) and render the material p-type (conductivity type due to holes) with resistivity in the $10^7$ Ohm-cm range. This typical resistivity of intrinsic $Cd_xZn_{1-x}Te$ ($0 \leq x \leq 1$) is at least 3 orders of magnitude lower than the maximum resistivity, $\geq 10^{10}$ Ohm-cm, achievable in this material. Defects and impurities that produce free holes are referred as acceptors.

By the deliberate introduction of impurities that produce charge carriers of opposite sign (i.e. electrons), the phenomenon of electrical compensation can be achieved. Defects and impurities providing free electrons to the crystals are referred to as donors. By the introduction of dopants of the opposite sign, the effect of the original dopants can be compensated. As a result, the concentration of free charge carriers can be made proportional to the difference of the concentrations of acceptor and donor defects. In $Cd_xZn_{1-x}Te$ ($0 \leq x \leq 1$) the column III impurities (B, Al, Ga, In, Tl) and the column VII impurities (F, Cl, Br, I) serve as donors and can be used to compensate the effect of acceptors such as cadmium vacancies. The net carrier concentration equals the difference of the concentration of the column III or column VII impurity and the concentration of the cadmium vacancies. In the method, the net carrier concentration is typically reduced by 2 to 6 orders of magnitude. It is, however, very difficult to reliably control the exact concentration of acceptor and donor defects and to achieve fully compensated (i.e., high resistivity, $\geq 10^{10}$ Ohm-cm) material. Typically, resistivity in the $10^6$-$10^9$ Ohm-cm range is achieved by column III or column VII impurity doping in $Cd_xZn_{1-x}Te$ ($0 \leq x \leq 1$).

In the present invention, one or two additional doping impurities, i.e., Ruthenium (Ru), Osmium (Os), or a combination of Ru and Os, is/are deliberately introduced in parallel with the column III or column VII impurity during the growth process of $Cd_xZn_{1-x}Te$ ($0 \leq x \leq 1$) to achieve full electrical compensation and high-resistivity (semi-insulating) material. By the introduction of these one or two additional doping impurities, which exhibit(s) an energy level close to the middle of the band gap of $Cd_xZn_{1-x}Te$ ($0 \leq x \leq 1$), in parallel with the column III or column VII dopant, fully compensated material is obtained. The impurity atoms with defect levels close to the middle of the band gap are called deep dopants (deep donors and acceptors). With this method, semi-insulating $Cd_xZn_{1-x}Te$ ($0 \leq x \leq 1$) with electrical resistivity exceeding $\geq 10^{10}$ Ohm-cm is reliably and reproducibly achieved. In the method, the additional deep dopant (i.e., Ru, Os, or the combination of Ru and Os) electrically compensates the residual charge carriers given by the difference of the concentrations of acceptors (i.e. cadmium vacancies) and donors (i.e. column III or column VII impurity). By the introduction of Ru and/or Os in sufficient concentration, the concentration of these deep defects dominate over the residual carrier concentration from the direct compensation between acceptors and donors. The residual carriers will reside at the deep defect levels and no free carriers remain to facilitate electrical conduction. As a result, fully compensated $Cd_xZn_{1-x}Te$ ($0 \leq x \leq 1$) with resistivity at or near the theoretical maximum value is reliably achieved.

In addition to electrically compensating the acceptors (i.e., cadmium vacancies), the column III or column VII impurity also combines with the cadmium vacancies to form impurity-vacancy pairs commonly known as A-centers. Specifically, the energy level of the cadmium vacancy defect is shifted to the lower energy level of the A-center. The lower energy of the new defect (A-center) reduces the residency time of charge carriers (holes) at the defect and increases the transport properties of carriers generated by the external X-ray and gamma-ray radiation. As a result, the performance of radiation detector devices fabricated from $Cd_xZn_{1-x}Te$ ($0 \leq x \leq 1$) crystals co-doped or tri-doped in the manner described above is greatly improved.

The use of two or more dopants in parallel also enables the use of the low concentrations of individual dopants to achieve fall compensation. This eliminates the adverse effects of single doping schemes using massive concentrations of the dopant on the carrier transport properties of $Cd_xZn_{1-x}Te$ ($0 \leq x \leq 1$).

Semi-insulating $Cd_xZn_{1-x}Te$ ($0 \leq x \leq 1$) crystals are typically grown or solidified from melt by the Bridgman method, the gradient freeze method, the electro-dynamic gradient freeze method, the so-call traveling heater method or by the vapor phase transport method. Growth can be implemented in any of these techniques in a high-pressure or low-pressure mode and either horizontally or vertically.

In accordance with the present invention, each of the foregoing crystal growth methods generally comprises (1) providing a melt comprised of a mixture of $Cd_xZn_{1-x}Te$, where $0 \leq x \leq 1$, a first dopant that adds shallow level donors (electrons) to the top of an energy band gap of said mixture when it is solidified, and a second dopant that adds deep level donors and/or acceptors to the middle of said energy band gap of said mixture when it is solidified, wherein the second dopant is either Ruthenium (Ru) or Osmium (Os); and (2) solidifying said melt in a manner to form the crystal.

The melt can also include a third dopant that adds deep level donors and/or acceptors to the middle of said energy band gap of said mixture when it is solidified, wherein the third dopant is the other one of Ruthenium (Ru) and Osmium (Os).

Desirably, the first dopant is an element from column III or column VII of the periodic table of the elements.

A gas can be introduced into the growth chamber during the growth process to suppress the escape of cadmium from the melt. This gas can be Nitrogen (N) or an inert gas such as Helium (He), Neon (Ne), Argon (Ar), Krypton (Kr), Xenon (Xe), Hydrogen (H) or Deuterium (D), or a combination of gases such as, without limitation, N/H, He/H, Ne/H, Ar/H, Kr/H, Xe/H, N/D, He/D, Ne/D, Ar/D, Kr/D and Xe/D. Moreover, in any of these crystal growth methods, the growth can be performed with or without partial pressure control of the crystal components (Cd, Zn and Te). The present invention pertains to doping in any crystal growth process.

With reference to FIG. 1, once a $Cd_xZn_{1-x}Te$ ($0 \leq x \leq 1$) crystal including one of the doping schemes discussed above has been formed into an ingot, a slice or wafer 2 of the crystal can be removed therefrom. Wafer 2 can then be formed into a pixilated array where each picture element or pixel 4 is capable of converting incident radiation, such as x-rays and gamma-rays, or incident particles, such as alpha or beta particles, into an electrical signal independent of every other pixel 4 of the array. Alternatively, wafer 2 can be a crystal that outputs an electrical signal in response to incident radiation or an incident particle, but which does not include a plurality of individual pixels 4. An example of wafer 2 having a plurality of pixels 4 isolated from each other is shown in FIG. 1. However, this is not to be construed as limiting the invention since a planar crystal can be formed in any desired and manufacturable size and shape. Wafer 2 can comprise a radiation detecting element of a radiation detection device 6 configured to detect and process, without limitation, X-ray and Gamma ray radiation events.

The invention has been described with reference to the preferred embodiments. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A radiation detector crystal made from a compound comprising:

$Cd_xZn_{1-x}Te$, where $0 \leq x \leq 1$;

an element from column III or column VII of the periodic table of the elements; and the element Ruthenium (Ru), the element Osmium (Os) or a combination of Ru and Os.

2. A radiation detector crystal of claim 1, wherein the element from column III or column VII of the periodic table of the elements has a concentration between about 1 to 10,000 atomic parts per billion.

3. A radiation detector crystal of claim 2, wherein the element Ruthenium (Ru), the element Osmium (Os) or the combination of Ru and Os has a concentration between about 1 to 10,000 atomic parts per billion.

4. A radiation detector crystal of claim 1, wherein the element Ruthenium (Ru), the element Osmium (Os) or the combination of Ru and Os has a concentration between about 1 to 10,000 atomic parts per billion.

5. A radiation detection device comprising a crystal made from a combination of $Cd_xZn_{1-x}Te$, where $0 \leq x \leq 1$; an element from column III or column VII of the periodic table of the elements; and the element Ruthenium (Ru), the element Osmium (Os) or a combination of Ru and Os.

6. A method of forming a radiation detector crystal comprising:

(a) providing a melt comprised of:

(1) a mixture of $Cd_xZn_{1-x}Te$, where $0 \leq x \leq 1$, (2) a first dopant that adds shallow level donors (electrons) to the top of an energy band gap of said mixture when it is solidified, and (3) a second dopant that adds deep level donors and/or acceptors to the middle of said energy band gap of said mixture when it is solidified, wherein the second dopant is one of the elements of Ruthenium (Ru) and Osmium (Os); and (b) solidifying said melt in a manner to form the crystal.

7. The method of claim 6, wherein a concentration of the element Ru or Os is between about 1 to 10,000 atomic parts per billion.

8. The method of claim 6, wherein the melt further includes a third dopant that adds deep level donors and/or acceptors to the middle of said energy band gap of said mixture when it is solidified, wherein the third dopant is the other one of the elements of Ruthenium (Ru) and Osmium (Os).

9. The method of claim 8, wherein a concentration of the element Ru, the element Os or the combination of the elements Ru and Os in the compound is between about 1 to 10,000 atomic parts per billion.

10. The method of claim 6, wherein the first dopant is an element from column III or column VII of the periodic table of the elements.

11. The method of claim 10, wherein the first dopant is an element selected from the group consisting of B, Al, Ga, In, Tl, F, Cl, Br and I.

12. The method of claim 6, wherein a concentration of the first dopant in the compound is between about 1 to 10,000 atomic parts per billion.

13. The method of claim 6, the crystal is formed by way of the Bridgman method, the gradient freeze method, the electro-dynamic gradient freeze method, the traveling heater method or by the vapor phase transport method.

14. The method of claim 13, wherein at least one of step (a) and step (b) is performed in the presence of a gas.

15. The method of claim 14, wherein the gas is at least one of Nitrogen (N), Helium (He), Neon (Ne), Argon (Ar), Krypton (Kr), Xenon (Xe), Hydrogen (H) and Deuterium (D).

* * * * *